United States Patent
Miyazaki et al.

(10) Patent No.: US 6,933,584 B2
(45) Date of Patent: Aug. 23, 2005

(54) SOLID STATE IMAGING DEVICE, METHOD OF MAKING THE SAME AND IMAGING UNIT INCLUDING THE SAME

(75) Inventors: Keishi Miyazaki, Hiroshima (JP); Yasuhito Kudo, Okayama (JP); Kimihide Sasaki, Hiroshima (JP)

(73) Assignee: Sharp Kabushiki Kaisha, Tokyo (JP)

( * ) Notice: Subject to any disclaimer, the term of this patent is extended or adjusted under 35 U.S.C. 154(b) by 216 days.

(21) Appl. No.: 10/241,297

(22) Filed: Sep. 11, 2002

(65) Prior Publication Data

US 2003/0057426 A1 Mar. 27, 2003

(30) Foreign Application Priority Data

Sep. 11, 2001 (JP) ........................................ 2001-275452

(51) Int. Cl.[7] ................ H01L 31/0232; H01L 31/0203; H01L 23/02
(52) U.S. Cl. ........................ 257/432; 257/433; 257/434; 257/680
(58) Field of Search ................................. 257/432, 433, 257/434, 680, 88

(56) References Cited

FOREIGN PATENT DOCUMENTS

| JP | 5-46046 | 6/1993 |
|---|---|---|
| JP | 10-326886 | 12/1998 |
| JP | 2000-125212 | 4/2000 |
| JP | 2000-307092 | 11/2000 |

*Primary Examiner*—Steven Loke
(74) *Attorney, Agent, or Firm*—David G. Conlin; David A. Tucker; Edwards & Angell, LLP

(57) ABSTRACT

A solid state imaging device includes a package substrate and a solid state imaging element on the package substrate. The package substrate has a mounting plane on which the solid state imaging element is mounted. The package substrate has two reference planes having the same height as the mounting plane, the reference planes projecting in two opposite directions from the mounting plane. The reference planes respectively have at least one pair of positioning reference holes formed therein, such that the centers of the respective pairs of holes are away from the center of an imaging plane of the solid state imaging element by the same distance. The imaging device is produced by fixing the imaging element on the mounting plane of the package substrate such that the center of the imaging element is aligned with the center of a phantom line diagonally connecting the center of one of the positioning reference holes in one of the reference planes with the center of one of the reference holes in the other of the reference planes. A solid state imaging unit utilizing the imaging device includes a lens mirror cylinder unit having pin members engaging diagonally opposed ones of each of the at least one pair of positioning reference holes, a reference plane corresponding to the reference planes of the package substrate and an optical lens having an optical axis that passes through the center of a phantom line connecting the centers of the pin members and the center of the imaging element.

12 Claims, 5 Drawing Sheets

SOLID STATE IMAGING DEVICE, METHOD OF MAKING THE SAME AND IMAGING UNIT INCLUDING THE SAME

BACKGROUND OF THE INVENTION

1. Field of the Invention

The present invention relates to a solid state imaging device including a solid state imaging element mounted on a packaging substrate, a method for producing the same, a solid state imaging unit including a lens mirror cylinder unit attached to the solid state imaging device, a method for producing the same, and an imaging apparatus using the same.

2. Description of the Related Art

Conventionally, a solid state imaging element including CCDs is used in various types of imaging apparatuses such as digital cameras and video cameras. When used in these imaging apparatuses, the solid state imaging element is combined with a lens mirror cylinder unit including an optical lens for focusing light, representing an image, on the solid state imaging element.

FIG. 4 shows a manner of combining a solid state imaging element 100B and a lens mirror cylinder unit. An optical axis L of an optical lens 100A of the lens mirror cylinder unit, and an imaging plane center C of the solid state element 100B, need to be positionally aligned with each other. The positional alignment is performed by adjustment of the angle of view based on X, Y and θ axes. In addition, a plane perpendicular to the optical axis L of the optical lens 100A needs to be parallel to an imaging plane of the solid state imaging element 100B. This is performed by focusing adjustment based on Z axis and tilt adjustment based on a and b axes. The tilt adjustment is performed for preventing partial defocusing. (The adjustment for preventing partial defocusing will be referred to simply as the "partial defocusing adjustment.") The positional adjustment based on the above-mentioned six axes is precisely performed in the micrometer ($\mu$m) order.

Conventionally, the positional alignment and adjustment based on these axes is performed over a long period of time using an expensive positional adjustment apparatus. For example, the positional alignment of the optical lens 100A and the solid state imaging element 100B is performed as follows.

As shown in FIG. 5, a package 101 having the solid state imaging element 100B mounted thereon is fixed to a metal plate 102 formed of, for example, aluminum, with an adhesive or the like.

Then, a lens mirror cylinder unit 103 having the optical lens 100A built therein is placed at a fixed position. With respect to the lens mirror cylinder unit 103, the solid state imaging element 100B is moved along and about the axes together with the package 101 provided on the metal plate 102, in units of very fine distance and very fine angle. By such movement, the optical lens 100A and the solid state imaging element 100B are positioned to have an optimal positional relationship, by which an output signal from the solid state imaging element 100B is optimal. In this position, the lens mirror cylinder unit 103 and the metal plate 102 hold the solid state imaging element 100B on the package 101. Thus, the solid state imaging element 100B and the lens mirror cylinder unit 103 are integrally fixed with each other by tightening members, such as screws 104 or the like.

In order to simplify the above-described step of positional alignment of the lens mirror cylinder unit 103 and the solid state imaging element 100B, the following proposals have been conventionally made.

Japanese Laid-Open Utility Mode Publication No. 5-46046 directed to a "Solid State Imaging Device" proposes the following technique. A solid state imaging element is mounted on apart of a flat plate having a surface polished so as to have a smoothness (surface roughness) of a maximum of about 5 $\mu$m. A package for covering this solid state imaging element is fixed such that the flat plate is partially exposed. The exposed part of the flat plate acts as a reference plane, i.e., a plane to which the lens mirror cylinder unit is to be attached.

According to Japanese Laid-Open Publication No. 2000-125212 directed to an "Imaging Module", a flat part of a ceramic plate is used both as a reference plane of a semiconductor chip and a reference plane of a lens mirror cylinder unit.

Japanese Laid-Open Publication No. 10-326886 directed to "Solid State Imaging Device and Method for Mounting Solid State Imaging Device" and Japanese Laid-Open Publication No. 2000-307092 directed to "Solid State Imaging Device, Camera Using the Same, and Method for Producing the Same" propose the following technique. A pilot portion which is opened outward is provided on a side surface of a package, and a guide portion which is opened outward is provided on a side surface facing the side surface provided with the pilot portion. Using the pilot portion and the guide portion, a solid state imaging element, a lens mirror cylinder unit and a wiring board are positioned with respect to each other by a jig having pins projecting therefrom.

The above-described conventional techniques have the following problems.

According to the techniques described in Japanese Laid-Open Utility Mode Publication No. 5-46046 and Japanese Laid-Open Publication No. 2000-125212, the plane vertical to the optical axis of the optical lens and the imaging plane of the solid state imaging element can be adjusted to be parallel to each other with high precision, for the following reason. Since the plane on which the solid state imaging element is mounted and the plane on which the lens mirror cylinder unit is mounted are coplanar, the adjustment based on Z axis (FIG. 5) (which is provided for focusing adjustment) and based on a and b axes (which are provided for tilt adjustment for partial defocusing adjustment) is performed with high precision. However, the optical axis of the lens mirror cylinder unit and the imaging plane center of the solid state imaging element cannot be aligned with high precision. The reason for this is because there is no reference position or plane for X, Y and θ axes, which are parallel to the plane on which the solid state imaging element is mounted.

According to the technique described in Japanese Laid-Open Publication No. 10-326886 and Japanese Laid-Open Publication No. 2000-307092, the positional alignment of the optical axis of the lens mirror cylinder unit and the imaging plane center of the solid state imaging element, i.e., the adjustment based on X, Y and θ axes, can be performed with high precision, by use of the pilot portion, the guide portion and the jig having pins projecting therefrom. However, the plane vertical to the optical axis of the optical lens and the imaging plane of the solid state imaging element cannot be adjusted to be parallel to each other with high precision. The reason for this is because there is no reference position or plane for Z axis (parallel to the pilot portion and the guide portion) provided for focusing adjustment and a and b axes provided for tilt adjustment for partial defocusing adjustment. Even for the positional adjustment based on X, Y and θ axes, this technique has inconveniences of requiring a positional adjustment jig having pins projecting therefrom and also requiring an additional step of alignment using the positional adjustment jig.

SUMMARY OF THE INVENTION

According to one aspect of the invention, a solid state imaging device includes a package substrate; and a solid state imaging element mounted on the package substrate. The package substrate has a mounting plane on which the solid state imaging element is mounted. The package substrate has two reference planes having the same height as the mounting plane, the reference planes projecting in two opposite directions from the mounting plane. The reference planes respectively have at least one pair of positioning reference holes therein, such that the centers of the pair of holes are away from the center of an imaging plane of the solid state imaging element by the same distance.

In one embodiment of the invention, the at least one pair of positioning reference holes formed in the reference plane are tapered so as to expand toward the side of the imaging plane of the solid state imaging element.

In one embodiment of the invention, the package substrate has a recessed portion having the mounting plane in a bottom portion thereof. The solid state imaging element is mounted on the mounting plane. Internal leads accommodated in the recessed portion are connected to electrodes of the solid state imaging element via thin metal lines, and are also connected to external leads. A transparent cap member is mounted so as to cover the recessed portion.

According to another aspect of the invention, in a method for producing the above-described solid state imaging device is provided. For mounting the solid state imaging element on the mounting plane of the package substrate, the center of the imaging plane is matched to the center of a phantom line connecting the centers of the at least one pair of reference holes, and thus solid state imaging element is fixed on the mounting plane.

According to still another aspect of the invention, a solid state imaging unit includes the above-described solid state imaging device, and a lens mirror cylinder unit. The lens mirror cylinder unit includes pin members respectively engageable with the at least one pair of positioning reference holes, a positioning reference plane corresponding to the reference planes of the solid state imaging device, and an optical lens provided such that an optical axis thereof passes through the center of a phantom line connecting the centers of the pin members. The pin members are put into engagement with the positioning reference holes so as to position the solid state imaging element and the optical lens with respect to each other, thus to attach the lens mirror cylinder unit to the package substrate.

In one embodiment of the invention, the pin members are tapered so as to be reduced in diameter toward tips thereof. The tapered pin members and the tapered positioning reference holes are engaged with each other, such that the positioning reference plane of the lens mirror cylinder unit is parallel to the reference planes of the solid state imaging device.

In one embodiment of the invention, the reference planes of the solid state imaging device each have two positional reference holes, thus forming a phantom rectangle. The package substrate is held and attached between the lens mirror cylinder unit and a wiring board, via two positioning reference holes provided on one of two phantom diagonal lines of the phantom rectangle.

According to still another aspect of the invention, a method for producing the above-described solid state imaging unit is provided. The pin members are respectively put into engagement with the positioning reference holes so as to position the solid state imaging element and the optical lens and also to attach the lens mirror cylinder unit to the package substrate.

In one embodiment of the invention, the wiring board has four insertion holes in positional correspondence with the four positioning reference holes. The lens mirror cylinder unit has two securing tapping holes for securing screws in addition to the pair of tapered pin members, the securing tapping holes and the tapered pin members positionally corresponding to the four positioning reference holes. The pair of tapered pin members are sequentially put into engagement with two of the positional reference holes and two of the insertion holes of the wiring board. Screws are sequentially put into engagement with the remaining two insertion holes, the remaining two positional reference holes, and then the securing tapping holes, thereby tightening the wiring board, the solid state imaging device and the lens mirror cylinder unit.

According to still another aspect of the invention, an imaging apparatus using the above-described solid state imaging device or the above-described solid state imaging unit is provided.

The function of the present invention will be described.

Conventionally, a solid state imaging element and an optical lens are produced in separate steps with prescribed precision. The two components need to be positioned with respect to each other with high precision. In the case of a solid state imaging device having a conventional structure, after the imaging element chip is mounted, the optical lens is positioned to the imaging element chip. In this step, a total of six axes are necessary, including axes for adjustment of the angle of view, and axes for tilt adjustment, in order to provide absolute precision of positioning the optical lens and the imaging element chip.

In the case of a package of a solid state imaging element having a conventional structure, the package is mounted on a substrate acting as a reference and then a lens mirror cylinder unit is mounted to the reference. Therefore, the dispersion factors are accumulated. In addition, as described above, a total of six axes are necessary for positioning the solid state imaging element and the optical lens (regarding optical axis center, horizontal and vertical planes, tilt, rotation, etc.).

According to the present invention, the package substrate itself of the solid state imaging device has reference holes for positioning the solid state imaging element to the mounting plane. The reference holes are also used for positioning the solid state imaging element and the lens mirror cylinder unit as follows. By inserting the pin members into the reference holes of the solid state imaging device, the solid state imaging element and optical lens can be positioned to each other and also the lens mirror cylinder unit can be attached to the package substrate. Thus, (i) positional alignment of the optical axis of the optical lens and the imaging plane center of the solid state imaging element, and (ii) adjustment of the plane vertical to the optical axis of the optical lens to be parallel to the imaging plane of the solid state imaging element, can both be performed with high precision and with a smaller number of steps.

Thus, the invention described herein makes possible the advantages of providing a solid state imaging device for realizing positional alignment of the optical axis of an optical lens and the imaging plane center of a solid state imaging element, and also realizing a plane vertical to the optical axis of the optical lens to be parallel to the imaging plane of the solid state imaging element, both with high precision and with a smaller number of steps, without using a positional adjustment jig, and a method for producing the same; a solid state imaging unit including the solid state imaging device, and a method for producing the same; and an imaging apparatus using the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, a solid state imaging unit according to the present invention will be described by way of illustrative examples with reference to the attached drawings.

Figure 1:
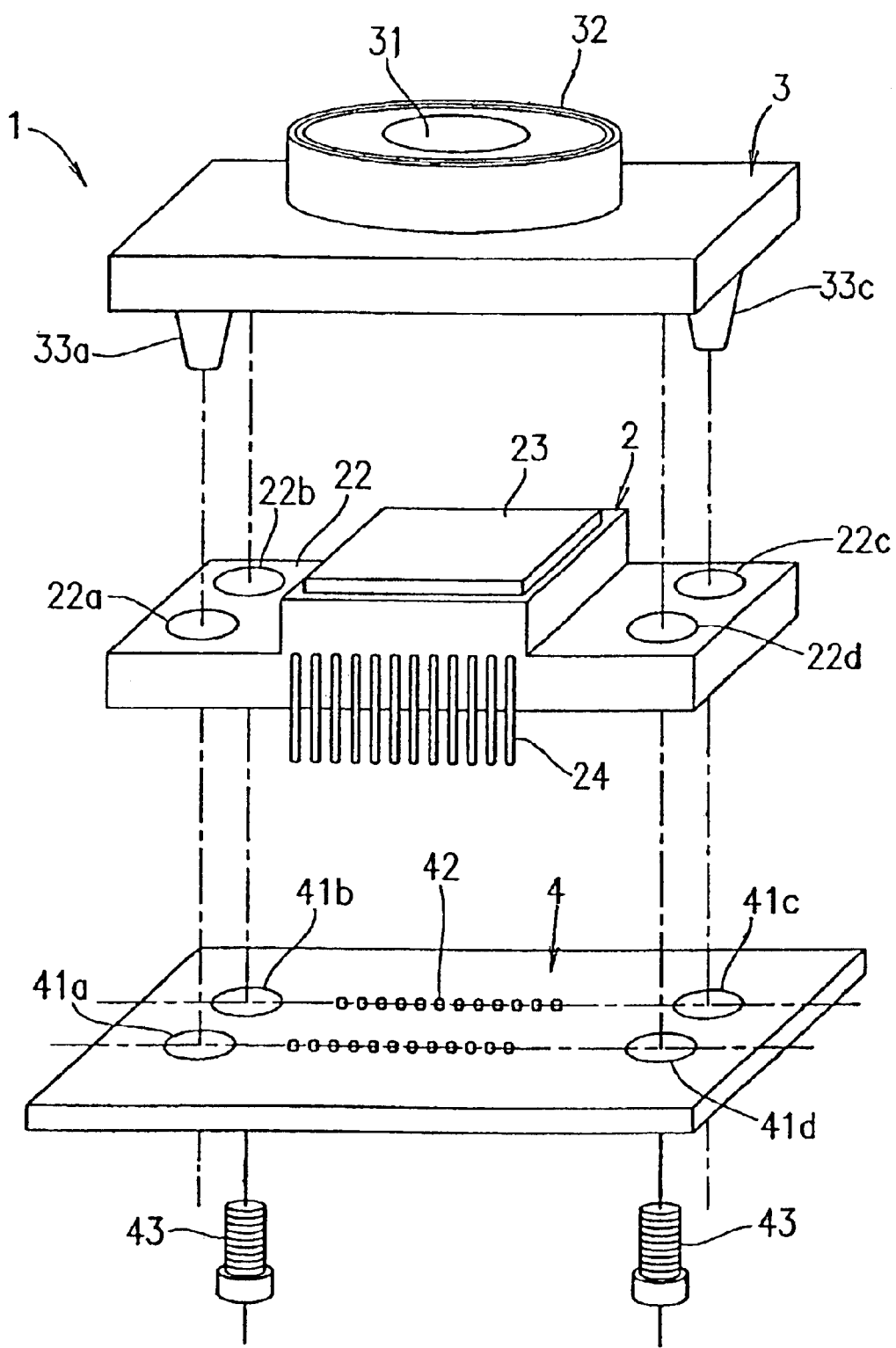
FIG. 1 is an exploded isometric view illustrating assembly of a solid state imaging unit according to an example of the present invention.

FIG. 1 is an exploded isometric view illustrating assembly of a solid state imaging unit 1 according to an example of the present invention.

As shown in FIG. 1, the solid state imaging unit 1 includes a solid state imaging device 2 including a solid state imaging element 21 mounted therein (described below with reference to FIG. 2), a lens mirror cylinder unit 3 including a lens 31 so as to focus light, representing a taken image, on the solid state imaging element 21, and a wiring board 4 for transferring an output signal from the solid state imaging element 21 to an external device. These elements are arranged and assembled to have an optimal positional relationship to each other.

Figure 2A:
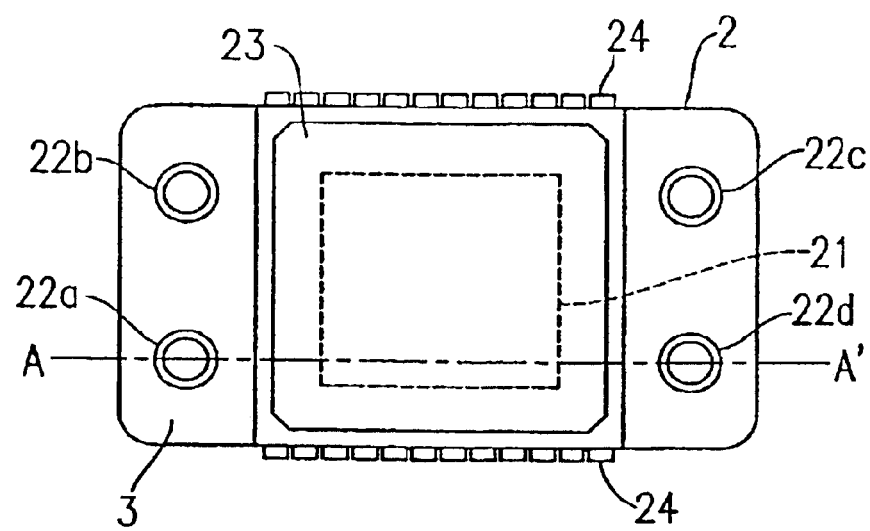
FIG. 2A is a plan view of a solid state imaging device according to an example of the present invention.
Figure 2B:
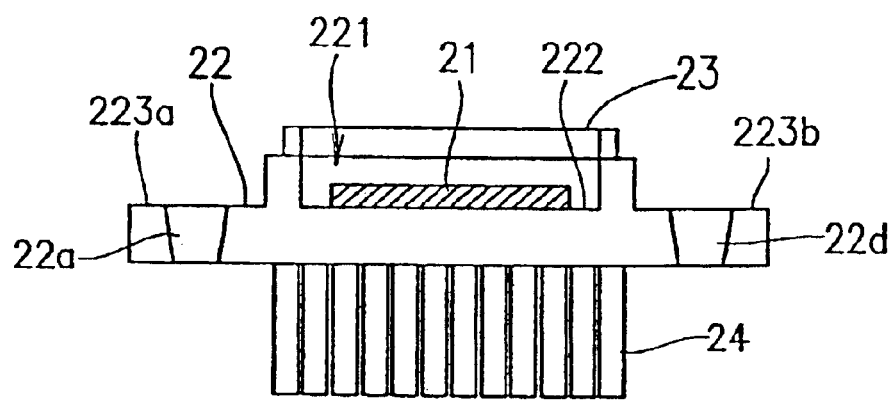
FIG. 2B is a cross-sectional view taken along line A–A' in FIG. 2A.

As shown in FIGS. 2A and 2B, the solid state imaging device 2 includes the solid state imaging element 21, a dual in-line package (DIP; hereinafter, referred to as the "package") 22 acting as a packaging substrate on which the solid state imaging element 21 is to be mounted, a transparent cap 23 for covering the solid state imaging element 21, and a plurality of external leads 24 for transferring an output signal for imaging from the solid state imaging element 21 to an external device.

The solid state imaging element 21 includes a plurality of CCDs arranged in a matrix. Each CCD converts light representing an image into an electric signal on a pixel-by-pixel basis.

The package 22 has a recessed portion 221 in a portion of a top surface thereof. The recessed portion 221 is generally square when seen from the top. A bottom portion of the recessed portion 221 includes a flat mounting plane 222 on which the solid state imaging element 21 is mounted. From two opposite sides of the recessed portion 221, brim-like edges project outward. On the brim-like edges, reference planes 223a and 223b (projecting areas) are provided, respectively. The reference planes 223a and 223b are flat and at the same height as the mounting plane 222. Positioning reference holes 22a and 22b are formed so as to pass through the brim-like edge from the reference plane 223a, and positioning reference holes 22c and 22d are formed so as to pass through the brim-like edge from the reference plane 223b. The solid state imaging device 2 is generally rectangular when seen from the top, and the four positioning reference holes 22a through 22d are located so as to form a phantom rectangle, the reference holes 22a through 22d being at the four corners of the phantom rectangle. The positioning reference holes 22a through 22d are used for positioning the solid state imaging element 21 and the lens mirror cylinder unit 3.

Among the four positioning reference holes 22a through 22d, two holes provided on a phantom diagonal line, e.g., the positioning reference holes 22a and 22c, are tapered such that the cross-sectional area thereof near the upper end (on the side of the solid state imaging element 21) is larger than the cross-sectional area thereof near the lower end.

The solid state imaging element 21 is positioned on the mounting plane 222 on the package 22 as follows. A phantom straight line connecting the centers of two circular positioning reference holes provided on a phantom diagonal line (e.g., the positioning reference holes 22a and 22c) is drawn. The center of the solid state imaging element 21 (imaging plane center) is aligned to the center of the phantom straight line. In this state, the solid state imaging element 21 is fixed on the mounting plane 222 with an adhesive or the like. The center of the solid state imaging element 21 is aligned to the center of the phantom straight line as follows. The positions in the package 22 acting as references (centers of the circular positioning reference holes) are optically recognized by an optical device, and the solid state imaging element 21 is fixed at a prescribed position in a prescribed direction from the reference positions (i.e., the center of the phantom diagonal line connecting the centers of the two positioning reference holes). This technique is generally used. The positioning reference holes 22b and 22d are usable instead of the positioning reference holes 22a and 22c.

The transparent cap 23 is a rectangular plate and is bonded so as to cover the inside of the recessed portion 221. Thus, the inside of the recessed portion 221 is sealed with the space above the solid state imaging element 21 being hollow.

The plurality of external leads 24 hang downward from two opposite sides of the rectangle of the solid state imaging device 2. Whereas the brim-like edges project from the shorter sides of the rectangle, the external leads 24 hang from a central portion of each longer side of the rectangle. Internal leads (not shown) provided in the recessed portion 221 on the package 22 are connected to electrodes (not shown) in the solid state imaging element 21 via thin metal lines (not shown) formed of aluminum or other metal. The internal leads are respectively connected to the external leads 24. Thus, the electrodes of the solid state imaging element 21 are respectively conducted to the external leads 24. The package 22 is not limited to be a pin insertion type package such as, for example, the dual in-line package, and may be a planar mounting type package in which the external leads 24 extend laterally or another planar mounting type package with no external leads.

Returning to FIG. 1, the lens mirror cylinder unit 3 includes a rectangular plate and a lens holder 32 provided on a central area of a top surface of the rectangular plate. The lens holder 32 accommodates a lens 31 embedded in the lens holder 32. The lens 31 is embedded while being rotated. The lens mirror cylinder unit 3 also includes positioning pins 33a and 33c (pin members) projecting downward from a bottom surface of the rectangular plate. The positioning pins 33a and 33c positionally correspond to the positioning reference holes 22a and 22c, respectively, provided on a phantom diagonal line, and are engageable with the positioning reference holes 22a and 22c. The rectangular plate of the lens mirror cylinder unit 3 also has tapping holes (not shown) for screws in the bottom surface thereof, in positional correspondence with the positioning reference holes 22b and 22d of the package 22. The bottom surface of the rectangular plate of the lens mirror cylinder unit 3 acts as a positioning reference plane which faces the reference planes 223a and 223b.

The positioning pins 33a and 33c are tapered such so as to be reduced in diameter toward tips thereof. The positioning pins 33a and 33c are tapered at an equal angle to the positioning reference holes 22a and 22c, such that the positioning reference holes 22a and 22c are respectively engaged with the positioning pins 33a and 33c. In this manner, the lens mirror cylinder unit 3 is positioned and attached to the package 22 having the solid state imaging element 21 mounted therein.

As can be appreciated, the positioning reference holes 22a and 22c, which are used for positioning the solid state imaging element 21 with respect to the package 22, are also used for positioning the solid state imaging device 2 to the lens mirror cylinder unit 3. The positioning pins 33a and 33c, which are provided so as to positionally correspond to the positioning reference holes 22a and 22c, are simply put into engagement with the positioning reference holes 22a and 22c. Such a simple operation realizes the adjustment shown in FIG. 4; i.e., both (i) positional alignment of the optical axis L of the lens (FIG. 4) and the imaging plane center C of the solid state imaging element; and also (ii) adjustment of a plane, vertical to the optical axis L of the lens, to be parallel to the imaging plane of the solid state imaging element. Namely, such a simple operation realizes positional adjustments based on six axes, including focusing adjustment based on Z axis, adjustment of the angle of view based on X, Y and θ axes, and tilt adjustment for partial defocusing adjustment based on a and b axes.

The wiring board 4 is a rectangular plate. The wiring board 4 has four circular holes 41a through 41d in positional correspondence with the positioning reference holes 22a through 22d of the package 22, respectively. The wiring board 4 also has a plurality of circular holes 42 in positional correspondence with the external leads 24 hanging from the package 22. The circular holes 41a and 41c, acting as positioning holes, respectively receive the positioning pins 33a and 33c inserted from above. The circular holes 41b and 41d, acting as attaching holes, respectively receive securing screws 43 inserted from below. The securing screws 43 are inserted through the circular holes 41b and 41d and the positioning reference holes 22b and 22d, and are tapped into the tapping holes formed in the bottom surface of the rectangular plate of the lens mirror cylinder unit 3. The wiring board 4 may be a glass epoxy board or a flexible board. The positioning holes 41a and 41c and the attaching holes 41b and 41d are not required to be very precise in size and may be formed with some tolerance.

Figure 3A:
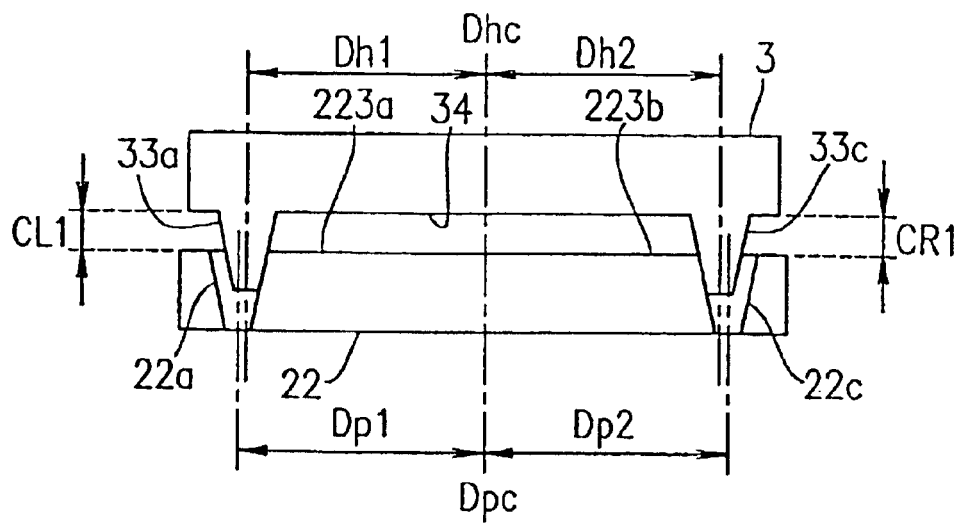
FIG. 3A illustrates a manner of positioning the solid state imaging device and a lens mirror cylinder unit according to the present invention, when the distance between two pin members is shorter than the distance between two positioning reference holes.
Figure 3B:
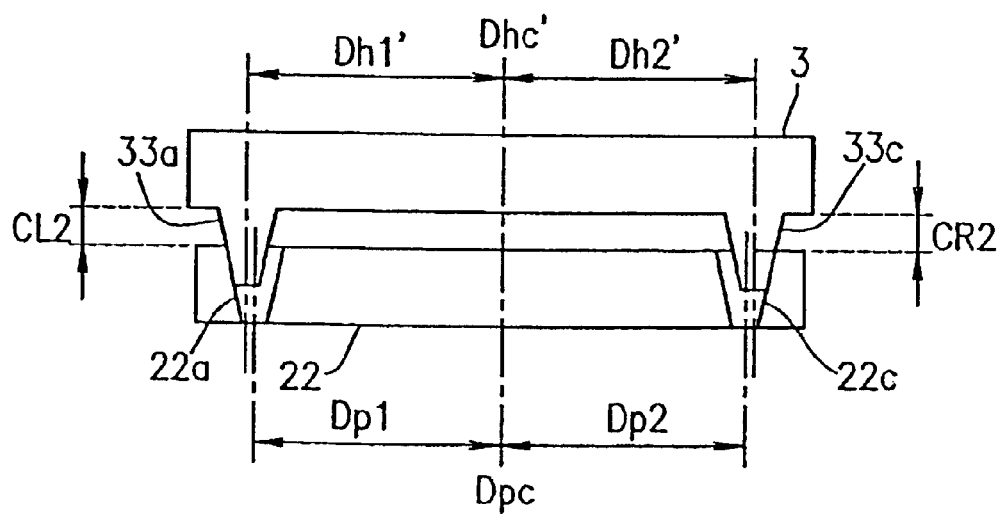
FIG. 3B illustrates a manner of positioning the solid state imaging device and a lens mirror cylinder unit according to the present invention, when the distance between two pin members is longer than the distance between two positioning reference holes.

With reference to FIGS. 3A and 3B, an exemplary manner of attaching the solid state imaging device 2 to the lens mirror cylinder unit 3 will be described.

Figure 4:
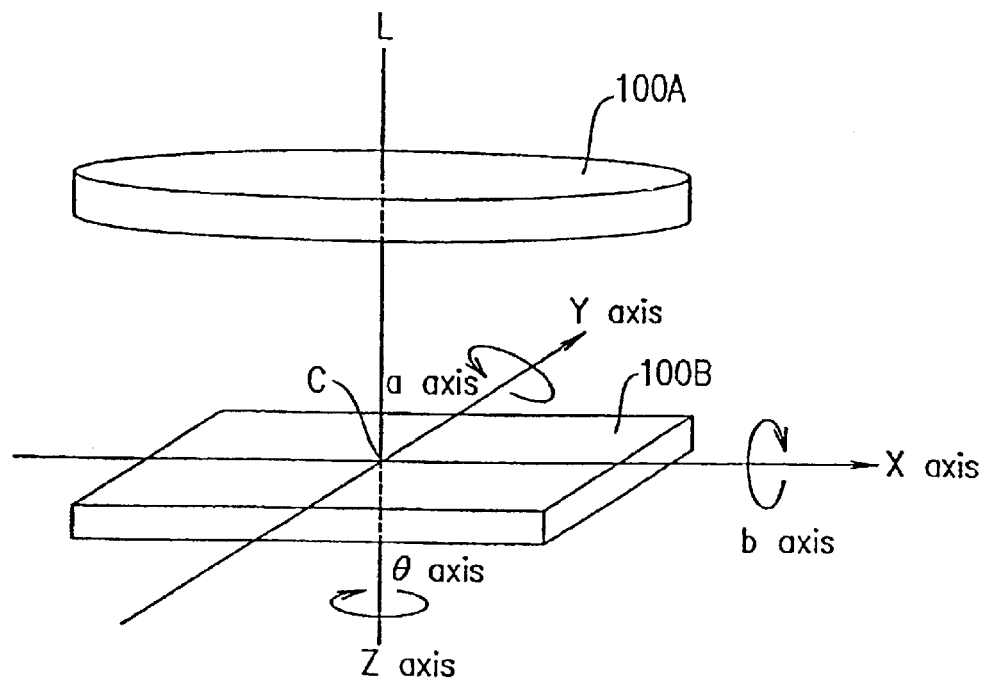
FIG. 4 schematically shows a principle of positioning a solid state imaging element and an optical lens.
Figure 5:
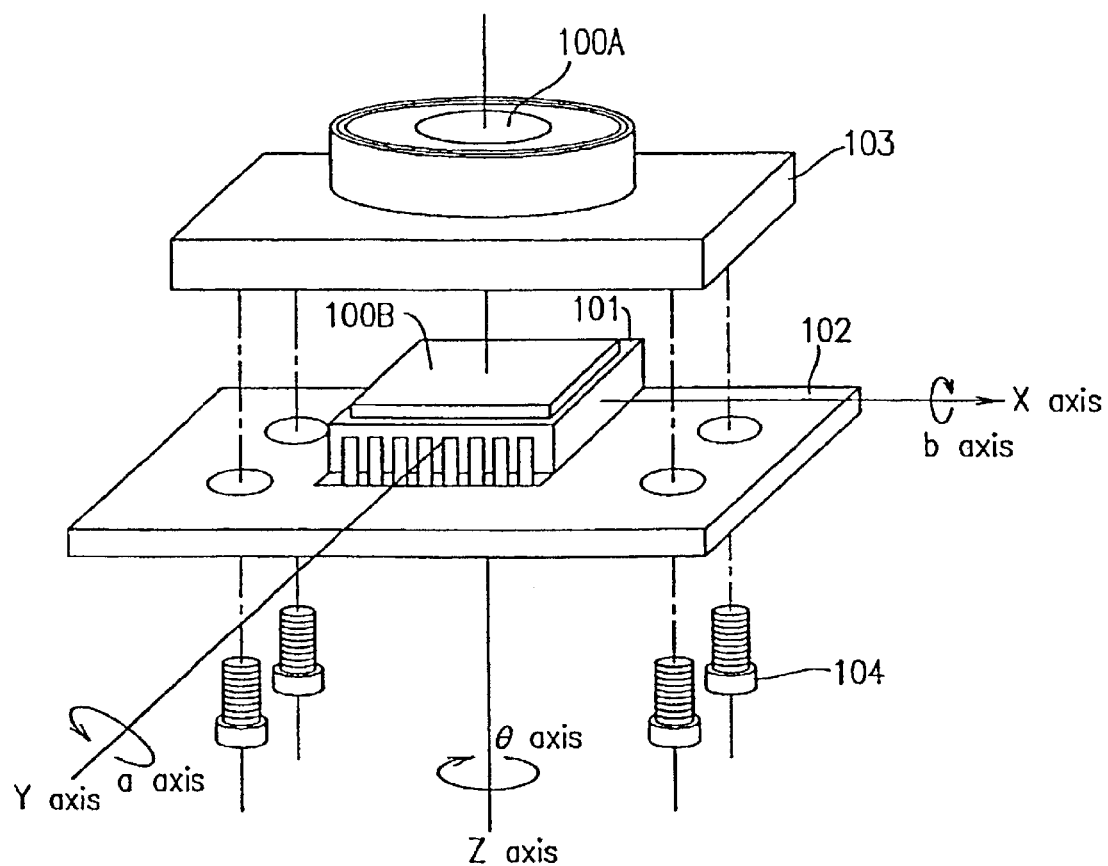
FIG. 5 is an exploded isometric view of conventional positional adjustment and assembly of a solid state imaging element and a lens mirror cylinder unit.

FIGS. 3A and 3B schematically illustrate how to realize the adjustment shown in FIG. 4; i.e., (i) positional alignment of the optical axis L of the lens and the imaging plane center C of the solid state imaging element; and (ii) adjustment of a plane, vertical to the optical axis of the lens, to be parallel to the imaging plane of the solid state imaging element. Namely, FIGS. 3A and 3B schematically illustrate how to realize positional adjustments based on six axes, including focusing adjustment based on Z axis, adjustment of the angle of view based on X, Y and θ axes, and tilt adjustment for partial defocusing adjustment based on a and b axes.

First, the positioning pins 33a and 33c of the lens mirror cylinder unit 3 are inserted into the positioning reference holes 22a and 22c of the solid state imaging device 2. The positioning pins 33a and 33c are longer than the thickness of the reference planes 223a and 223b having the positioning reference holes 22a and 22c formed therein, and thus are inserted to the positioning holes 41a and 41c of the wiring board 4 through the positioning reference holes 22a and 22c. Thus, the lens mirror cylinder unit 3, the solid state imaging device 2 and the wiring board 4 can be positioned with respect to each other.

Next, the securing screws 43 are inserted into the attaching holes 41b and 41d from below the wiring board 4. The securing screws 43 reach the rectangular plate of the lens mirror cylinder unit 3 via the attaching holes 41b and 41d, the positioning reference holes 22b and 22d, and the tapping holes (not shown) formed in the rectangular plate. The securing screws 43 are tightened to the rectangular plate of the lens mirror cylinder unit 3 with the same torque. Thus, the lens mirror cylinder unit 3, the solid state imaging device 2 and the wiring board 4 are secured with respect to each other.

With reference to FIGS. 3A and 3B, high precision positioning of the solid state imaging device 2 and the lens mirror cylinder unit 3 will be described.

FIGS. 3A and 3B are each a cross-sectional view of the assembly of solid state imaging device 2 and the lens mirror cylinder unit 3, taken along the phantom diagonal line connecting the centers of the positioning reference holes 22a and 22c. In FIGS. 3A and 3B, Dpc represents the center of the phantom diagonal line, which matches the imaging plane center C of the solid state imaging element 21. Dp1 is the length between the center Dpc and the center of the positioning reference hole 22a, and Dp2 is the length between the center Dpc and the center of the positioning reference hole 22c. Dhc is the center of the rectangular plate of the lens mirror cylinder unit 3 which matches the center Dpc. Dh1 is the length between the center Dhc and the center of the positioning pin 33a, and Dh2 is the length between the center Dhc and the center of the positioning pin 33c.

In FIG. 3A, (Dh1+Dh2) is shorter than (Dp1+Dp2). In this case, the solid state imaging device 2 and the lens mirror cylinder unit 3 are positioned with respect to each other along the inner portion of the tapered wall of each of the positioning reference holes 22a and 22c.

In FIG. 3B, (Dh1+Dh2) is longer than (Dp1+Dp2). In this case, the solid state imaging device 2 and the lens mirror cylinder unit 3 are positioned with respect to each other along the outer portion of the tapered wall of each of the positioning reference holes 22a and 22c.

In either case, the center Dpc and the center Dhc match each other. In this example, the diagonal line connecting the centers of the positioning reference holes 22a and 22c is used for positioning, but the present invention is not limited to this.

In this manner, the solid state imaging element 21 and the optical lens 31 are positionally aligned in terms of the centers thereof, and are also adjusted to be parallel to each other, with high precision. Namely, positional adjustments based on five axes, including adjustment of the angle of view based on X, Y and θ axes, and tilt adjustment for partial defocusing adjustment based on a and b axes are realized with high precision.

The positioning pins 33a and 33c are guided along the tapered walls of the positioning reference holes 22a and 22c, respectively, so that the positioning pins 33a and 33c are inserted into the positioning reference holes 22a and 22c to the same level as each other. This will be described more specifically. In FIGS. 3A and 3B, reference numeral 34 represents a reference plane 34 (bottom surface of the rectangular plate of the lens mirror cylinder unit 3) having the positioning pins 33a and 33c formed thereon. As described above, the positioning reference hole 22a extends from the reference plane 223a, and the positioning reference hole 22c extends from the reference plane 223b. A gap CL between the reference plane 223a and the reference plane 34 is equal to a gap CR between the reference plane 223b and the reference plane 34. In FIG. 3A, CL1=CR1. In FIG. 3B, CL2=CR2. As a result, the reference planes 223a and 223b are parallel to the reference plane 34. Thus, focusing adjustment based on Z axis is performed.

Instead of positioning reference holes 22a and 22c, the positioning reference holes 22b and 22d may be used. In this case, the positioning reference holes 22b and 22d are also used for positioning the solid state imaging element 21 in the recessed portion 221 of the package 22. The lens mirror cylinder unit 3 has positioning pins in positional correspondence with the positioning reference holes 22b and 22d, instead of the positioning pins 33a and 33c. The tapping holes (not shown) in the bottom surface of the rectangular plate of the lens mirror cylinder unit 3 are also formed in positional correspondence with the positioning reference holes 22a and 22c, instead of the positioning reference holes 22b and 22d.

In this state, however, the focusing adjustment based on Z axis does not have high precision. After the above-described step of assembly is completed, the optical lens 31 is rotated in the lens holder 32 so as to obtain an optimal output signal. Thus, the focusing adjustment based on Z axis obtains high precision.

As described above, the solid state imaging device 2 and the lens mirror cylinder unit 3 can be positioned with respect to each other with high precision while being assembled together, by the principle illustrated in FIGS. 3A and 3B.

With the state of the art, the chip of the solid state imaging element 21 and the package 22 are positioned with respect to each other with sufficiently high precision, and the lens mirror cylinder unit 3 having the tapered pin members 33a and 33c and the optical lens 31 are also positioned with respect to each other with sufficiently high precision.

In summary, the present invention solves the above-described problems as follows.

The solid state imaging element 21 is fixed on the mounting plane 222 in the recessed portion 221 provided on the top surface of the package 22 with an adhesive or the like. The internal leads (not shown) in the recessed portion 221 of the package 22 and the electrodes (terminals) of the solid state imaging element 21 are respectively connected by thin metal lines formed of aluminum or other metal, and the internal leads are conducted to the external leads 24. The transparent cap 23 is bonded to the package 22, so that the recessed portion 221 is sealed while accommodating the solid state imaging element 21. The space in the recessed portion 221 above the solid state imaging element 21 is hollow.

The brim-like edges are projected from two opposite sides of the package 22. The brim-like edges respectively have the reference planes 223a and 223b (projecting areas), which are at the same height as the mounting plane 222 on which the solid state imaging element 21 is mounted. The four positioning reference holes 22a through 22d are formed on the brim-like edges. For example, the positioning reference holes 22a and 22b extend downward from the reference plane 223a, and the positioning reference holes 22c and 22d extend downward from the reference plane 223b. The positioning reference holes 22a through 22d are tapered so as to be used for positioning the solid state imaging device 2 and the lens mirror cylinder unit 3.

Among the four positioning reference holes 22a through 22d, the two positioning reference holes provided on a phantom diagonal line (e.g., 22a and 22c) are used as a reference for mounting the solid state imaging element 21.

The pair of tapered pins 33a and 33c of the lens mirror cylinder unit 3 are put into engagement with the reference positioning holes 22a and 22c. Thus, the solid state imaging device 2 and the lens mirror cylinder unit 3 are positioned with respect to each other. Then, the securing screws 43 are put into engagement with the attaching holes 41b and 41d corresponding to the tapping holes of the lens mirror cylinder unit 3. The securing screws 43 are then inserted through the positioning reference holes 22b and 22d and then the tapping holes. Thus, the wiring board 4, the package 22 and the lens mirror cylinder unit 3 are tightened together.

As described above, according to the present invention, the package having the solid state imaging element mounted therein is provided with projecting areas (reference planes 223a and 223b) at the same height as the mounting plane 222 on which the solid state imaging element is mounted. The projecting areas extend in two opposite directions from the mounting plane. In addition, the positioning reference holes 22a through 22d are formed so as to extend downward from the reference planes 223a and 223b, respectively. Owing to such a structure, the package 22 having the solid state imaging element 21 mounted therein and the lens mirror cylinder unit 3 are positioned to each other with high precision without any special adjustment step. This positioning corresponds to both (i) positional alignment of the optical axis L of the lens and the imaging plane center C of the solid state imaging element, and (ii) adjustment of a plane vertical to the optical axis of the lens to be parallel to the imaging plane of the solid state imaging element. In other words, positional adjustments based on six axes, including focusing adjustment based on Z axis, adjustment based on X, Y and θ axes, and tilt adjustment for partial defocusing adjustment based on a and b axes, are performed in a short time, easily, and with high precision. Therefore, the special positional adjustment device, jig and the like, which are conventionally used, are not necessary. The positional adjustment operation is significantly simplified.

In the above-described example, the positioning pins 33a and 33c are not stepped. Alternatively, the positioning pins 33a and 33c may have a stepped structure. In this case, the stepped portions (brim-like portions) act as stoppers for the reference planes 223a and 223b. Thus, it is guaranteed that the positioning pins 33a and 33c are adjusted to be inserted to the same depth in the positioning reference holes 22a and 22c.

As has been described so far, according to the present invention, after the solid state imaging element is positioned with respect to the mounting plane, the optical axis of the lens mirror cylinder unit and the imaging plane center of the solid state imaging element are positioned with respect to each other, using the reference planes at the same height as the mounting plane of the solid state imaging element and also using the tapered positioning reference holes provided in the reference planes. In other words, (i) positional alignment of the optical axis of the lens and the imaging plane center of the solid state imaging element (i.e., adjustment based on X, Y and θ axes), and (ii) adjustment of a plane vertical to the optical axis of the lens to be parallel to the imaging plane of the solid state imaging element (i.e., focusing adjustment based on Z axis, and tilt adjustment for partial defocusing adjustment based on a and b axes), are performed. Such adjustments based on the six axes are performed in the micrometer ($\mu$m) order, in a short time, easily and with high precision, without using any special positional adjustment device, jig and the like, as conventionally required.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid state imaging device, comprising:
   a package substrate; and
   a solid state imaging element mounted on the package substrate, wherein:
   the package substrate has a mounting plane on which the solid state imaging element is mounted,
   the package substrate has two reference planes having the same height as the mounting plane, the reference planes projecting in two opposite directions from the mounting plane, and
   the reference planes respectively have at least one pair of positioning reference holes formed therein, such that the centers of the respective pairs of holes are located on lines perpendicular to the direction at which their associated reference plane projects from the mounting plane and away from the center of an imaging plane of the solid state imaging element by the same distance.

2. A solid state imaging device according to claim 1, wherein
   the at least one pair of positioning reference holes formed in the reference planes respectively are tapered so as to expand toward the side of the imaging plane of the solid state imaging element.

3. A solid state imaging device according to claim 2, wherein:
   the package substrate has a recessed portion having the mounting plane in a bottom portion thereof,
   the solid state imaging element is mounted on the mounting plane,
   internal leads accommodated in the recessed portion are connected to electrodes of the solid state imaging element via thin metal lines, and are also connected to external leads, and
   a transparent cap member is mounted so as to cover the recessed portion.

4. A solid state imaging device according to claim 1, wherein:
   the package substrate has a recessed portion having the mounting plane in a bottom portion thereof,
   the solid state imaging element is mounted on the mounting plane,
   internal leads accommodated in the recessed portion are connected to electrodes of the solid state imaging element via thin metal lines, and also are connected to external leads, and
   a transparent cap member is mounted so as to cover the recessed portion.

5. A solid state imaging unit, comprising:
   a solid state imaging device according to claim 1, and
   a lens mirror cylinder unit, wherein: the lens mirror cylinder unit includes pin members respectively engageable with diagonally opposed ones of each of the at least one pair of positioning reference holes, a positioning reference plane corresponding to the reference planes of the package substrate of the solid state imaging device, and an optical lens provided such that an optical axis thereof passes through the center of a phantom line connecting the centers of the pin members, and
   the pin members are put into engagement with the positioning reference holes so as to position the solid state imaging element and the optical lens with respect to each other, thus to attach the lens mirror cylinder unit to the package substrate.

6. A solid state imaging unit according to claim 5, wherein:
   the pin members are tapered so as to be reduced in diameter toward the tips thereof, and
   the pin members and the positioning reference holes are engaged with each other, such that the positioning reference plane of the lens mirror cylinder unit is parallel to the reference planes of the package substrate of the solid state imaging device.

7. A solid state imaging unit according to claim 6, wherein:
   the pairs of reference holes in the respective reference planes of the package substrate of the solid state imaging device define the corners of a phantom rectangle, and
   the package substrate is held and attached between the lens mirror cylinder unit and a wiring board, via two positioning reference holes provided on one of two phantom diagonal lines of the phantom rectangle that are not engaged by said pin members.

8. A solid state imaging unit according to claim 5, wherein:
   the pairs of reference holes in the respective reference planes of the package substrate of the solid state imaging device define the corners of a phantom rectangle, and
   the package substrate is held and attached between the lens mirror cylinder unit and a wiring board, via two positioning reference holes provided on one of two phantom diagonal lines of the phantom rectangle that are not engaged by said pin members.

9. An imaging apparatus using a solid state imaging device according to claim 1 or a solid state imaging unit according to claim 5.

10. A method for producing a solid state imaging device comprising the steps of:

providing a solid state imaging element having an imaging plane;

providing a package substrate, said package substrate having (i) a mounting plane, and (ii) two reference planes having the same height as the mounting plane, the reference planes projecting in two opposite directions from the mounting plane, and respectively having at least one pair of positioning reference holes formed therein such that the centers of the respective pairs of holes are located on lines perpendicular to the direction at which their associated reference plane projects from the mounting plane and away from the center of the imaging plane of the solid state imaging element by the same distance; and mounting the solid state imaging element on, and affixing the solid state imaging element to, the mounting plane of the package substrate such that the center of the imaging plane is matched to the center of a phantom line diagonally connecting the centers of one of the reference holes in one of the reference planes with the center of one of the reference holes in the other of the reference planes.

11. A method for producing a solid state imaging unit comprising the steps of:

providing a package substrate;

providing a solid state imaging element mounted on the package substrate, wherein:

the package substrate has a mounting plane and two reference planes (i) having the same height as the mounting plane, (ii) projecting in two opposite directions from the mounting plane, and (iii) respectively having at least one pair of positioning reference holes formed therein such that the centers of the respective pairs of holes are located on lines perpendicular to the direction at which their associated reference plane projects from the mounting plane and away from the center of an imaging plane of the solid state imaging element by the same distance, the positioning reference holes formed in the reference planes respectively being tapered so as to expand toward the side of the imaging plane of the solid state imaging element;

providing a lens mirror cylinder unit, the lens mirror cylinder unit including:

pin members respectively engageable with diagonally opposed ones of each of the at least one pair of positioning reference holes, a positioning reference plane corresponding to the reference planes of the package substrate and an optical lens provided such that an optical axis thereof passes through the center of a phantom line connecting the centers of the pin members, and engaging the pin members respectively with the positioning reference holes so as to position the solid state imaging element and the optical lens and also to attach the lens mirror cylinder unit to the package substrate.

12. A method according to claim 11, further comprising the steps of:

providing a wiring board having four insertion holes in positional correspondence with the pairs of positioning reference holes located in the respective reference planes of the package substrate, providing the lens mirror cylinder unit with two securing tapping holes for securing screws such that the securing tapping holes and tapered pin members positionally correspond respectively to the positioning reference holes, sequentially placing the pair of tapered pin members into engagement with two of the positional reference holes of the package substrate and two of the insertion holes in the wiring board, and providing and sequentially engaging screws with the remaining insertion holes, and then the tapping holes so as to thereby tighten together the wiring board, the package substrate and the lens mirror cylinder unit.

* * * * *